United States Patent
Dye et al.

(10) Patent No.: US 9,489,476 B2
(45) Date of Patent: Nov. 8, 2016

(54) POST PROCESSING FINITE ELEMENT ANALYSIS GEOMETRY

(71) Applicant: SOLAR TURBINES INCORPORATED, San Diego, CA (US)

(72) Inventors: Christopher Marc Dye, San Diego, CA (US); Angelo Vincent Marasco, San Diego, CA (US)

(73) Assignee: Solar Turbines Incorporated, San Diego, CA (US)

(*) Notice: Subject to any disclaimer, the term of this patent is extended or adjusted under 35 U.S.C. 154(b) by 348 days.

(21) Appl. No.: 14/178,144

(22) Filed: Feb. 11, 2014

(65) Prior Publication Data

US 2015/0227657 A1   Aug. 13, 2015

(51) Int. Cl.
*G06F 17/50* (2006.01)

(52) U.S. Cl.
CPC ....... *G06F 17/5018* (2013.01); *G06F 17/5086* (2013.01)

(58) Field of Classification Search
USPC .................................................. 703/2, 5, 6
See application file for complete search history.

(56) References Cited

U.S. PATENT DOCUMENTS

| | | | | |
|---|---|---|---|---|
| 6,018,497 A | * | 1/2000 | Gunasekera | G01V 1/28 367/38 |
| 6,078,869 A | * | 6/2000 | Gunasekera | G01V 1/28 367/69 |
| 7,428,480 B2 | | 9/2008 | Deguchi | |
| 7,707,016 B2 | | 4/2010 | Shaw | |
| 7,881,878 B2 | * | 2/2011 | Burrus | G01R 33/56341 600/410 |
| 8,140,175 B2 | | 3/2012 | Smith et al. | |
| 2006/0149517 A1 | | 7/2006 | El-Sayed et al. | |
| 2012/0316821 A1 | | 12/2012 | Levermore et al. | |

FOREIGN PATENT DOCUMENTS

CN         103246793 A         8/2013

* cited by examiner

*Primary Examiner* — Thai Phan
(74) *Attorney, Agent, or Firm* — Procopio, Cory, Hargreaves & Savitch LLP

(57) ABSTRACT

A method for designing a component for a circumferential machine is disclosed. The method includes selecting one or more seed nodes, creating a cylindrical coordinate system, and selecting an output subset. The method further includes creating a node set from the one or more seed nodes based on a selected feature of the component to be analyzed. The method yet further includes extracting an output for the node set from the finite element analysis module for each load cycle and presenting a result from the extracted output.

20 Claims, 5 Drawing Sheets

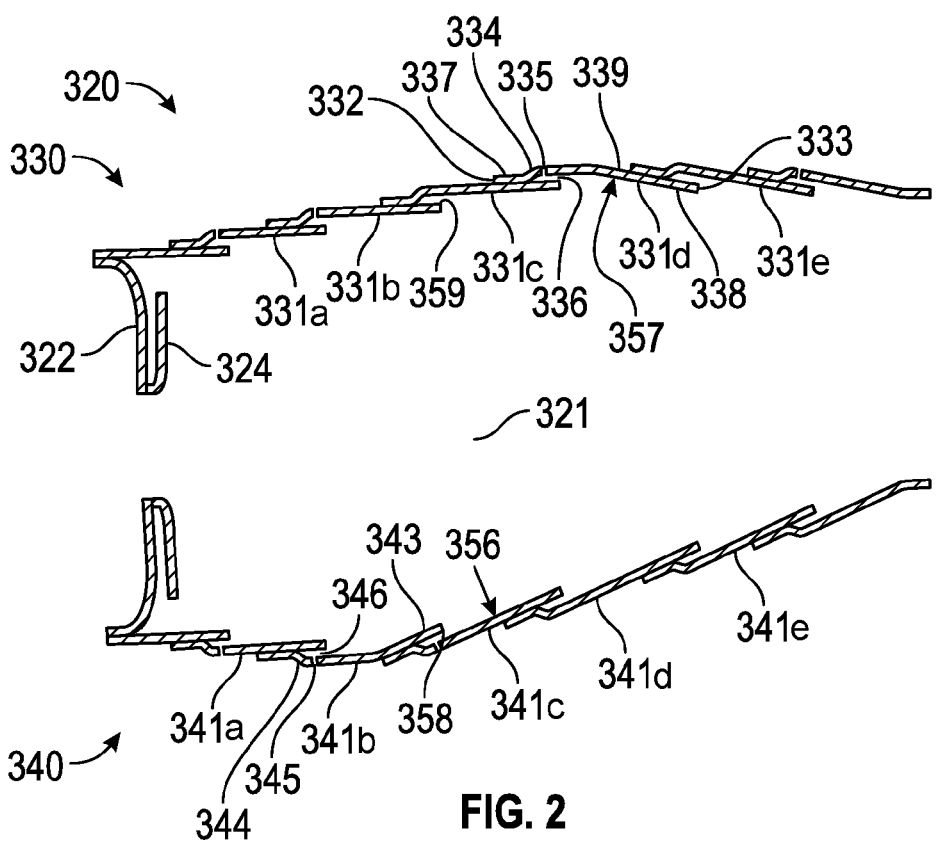
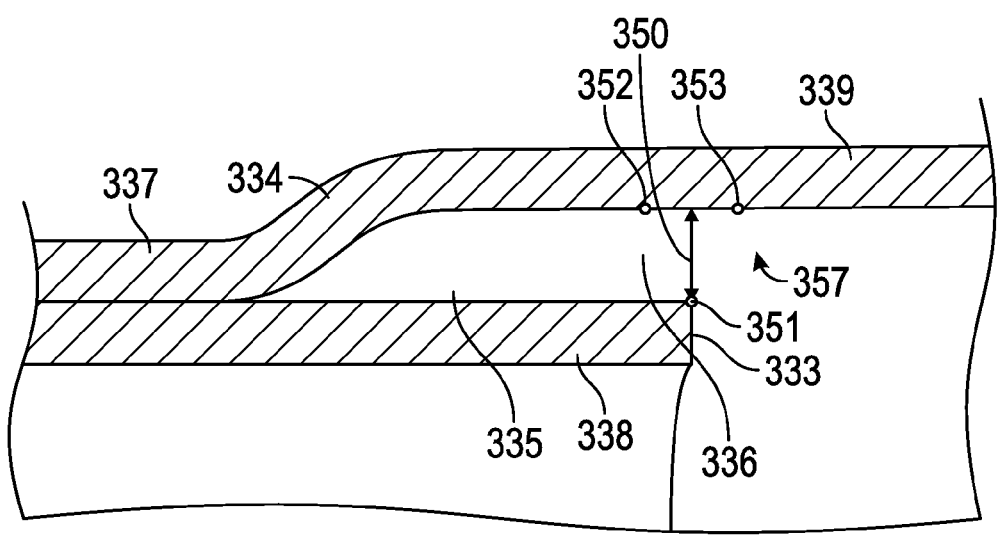
FIG. 2
FIG. 3

POST PROCESSING FINITE ELEMENT ANALYSIS GEOMETRY

TECHNICAL FIELD

The present disclosure generally pertains to finite element analysis, and is more particularly directed toward post processing finite element analysis of the geometry for components of a gas turbine engine.

BACKGROUND

Gas turbine engines include an inlet, a compressor section, a combustor section, a turbine section, and an exhaust. The extreme operating conditions of the gas turbine engine result in creep, fatigue, and other damage to the various components of the gas turbine engine during each load cycle of the gas turbine engine. Finite element analysis simulations may be used to predict the effects of one or more given load cycles on a particular component of the gas turbine engine. The results of the finite element analysis simulations may need to be post processed to extract meaningful results.

U.S. Pat. No. 7,428,480 to M. Deguchi is directed to a computer aided design (CAD) analysis result data processing apparatus having an analysis result data obtaining part for obtaining analysis result data of an analytic simulation for dividing a three dimensional object into a plurality of elements and performing an analysis of a predetermined physical quantity; based on the analysis result data obtained by the analysis result data obtaining part, extract surfaces constituting an outside form of the object from the surfaces constituting the plurality of elements; and based on the analysis result data obtained by the analysis result data obtaining part, obtain coordinates of the object after deformation by the analytic simulation for nodes constituting the surfaces extracted.

The present disclosure is directed toward overcoming one or more of the problems discovered by the inventors or that is known in the art.

SUMMARY OF THE DISCLOSURE

In one embodiment of the present invention a method for designing a component for a circumferential machine using a finite element analysis system including a finite element analysis module for one or more predetermined load cycles is disclosed. The method includes preparing a model of the component using the finite element analysis module including selecting one or more seed nodes, creating a cylindrical coordinate system relative to the selected feature, and an output subset. The method also includes querying the finite element analysis module for the one or more seed nodes and the cylindrical coordinate system. The method further includes creating a node set from the one or more seed nodes based on a predetermined geometric path relative to the cylindrical coordinate system and defined by a selected feature of the component to be analyzed. The method yet further includes extracting the node set from the finite element analysis module with an output for each element of the output subset for each node of the node set for each load cycle. The method still further includes presenting a result of extracting the node set with the output for each element.

In another embodiment of the present invention, a finite element analysis system for designing a component of a gas turbine engine is disclosed. The finite element analysis system includes a processor, a finite element analysis module, a processing module, and a post processing module. The finite element analysis module is configured to model a component of a gas turbine engine into a contiguous set of finite elements connected together by a set of nodes and determine the effects one or more load cycles has on one or more nodes of the set of nodes. The processing module is configured to query the finite element analysis module for one or more selected seed nodes, and create a node set based off of the one or more selected seed nodes by selecting nodes from the set of nodes that are within a tolerance that follows a predetermined pattern from each of the one or more selected seed nodes. The post processing module is configured to sort the node set in order along the predetermined geometric pattern, extract an output for the effect that each load cycle has on each node of the node set, aggregate the extracted output for the effect each load cycle has on each node of the node set, and display the aggregated output for the effect of each load cycle in a presentable chart.

BRIEF DESCRIPTION OF THE DRAWINGS

FIG. 2 is cross-sectional view of an exemplary circumferential component for the circumferential machine of FIG. 1.

FIG. 3 is a cross-sectional view of a portion of the outer liner of FIG. 2.

DETAILED DESCRIPTION

The systems and methods disclosed herein include a circumferential machine and a finite element analysis (FEA) system for designing and analyzing components of the circumferential machine. The FEA system and methods disclosed herein may be used for analyzing the effects of one or more load cycles on a component, such as the combustion chamber disclosed in FIGS. 2 and 3, of a gas turbine engine, such as the gas turbine engine disclosed in FIG. 1, and in particular may be used for analyzing the effects of one or more load cycles on a selected feature of the component. The FEA system and methods may identify and select a node set representative of the selected feature based on one or more seed nodes, may extract the desired information to be analyzed, and may analyze the information with limited user input. The use of the FEA system and methods for identification and selection of nodes, and for extraction and analysis of the results may reduce the man hours for analyzing the selected feature of the component from 4-24 man hours to less than 1 man hour.

Figure 1:
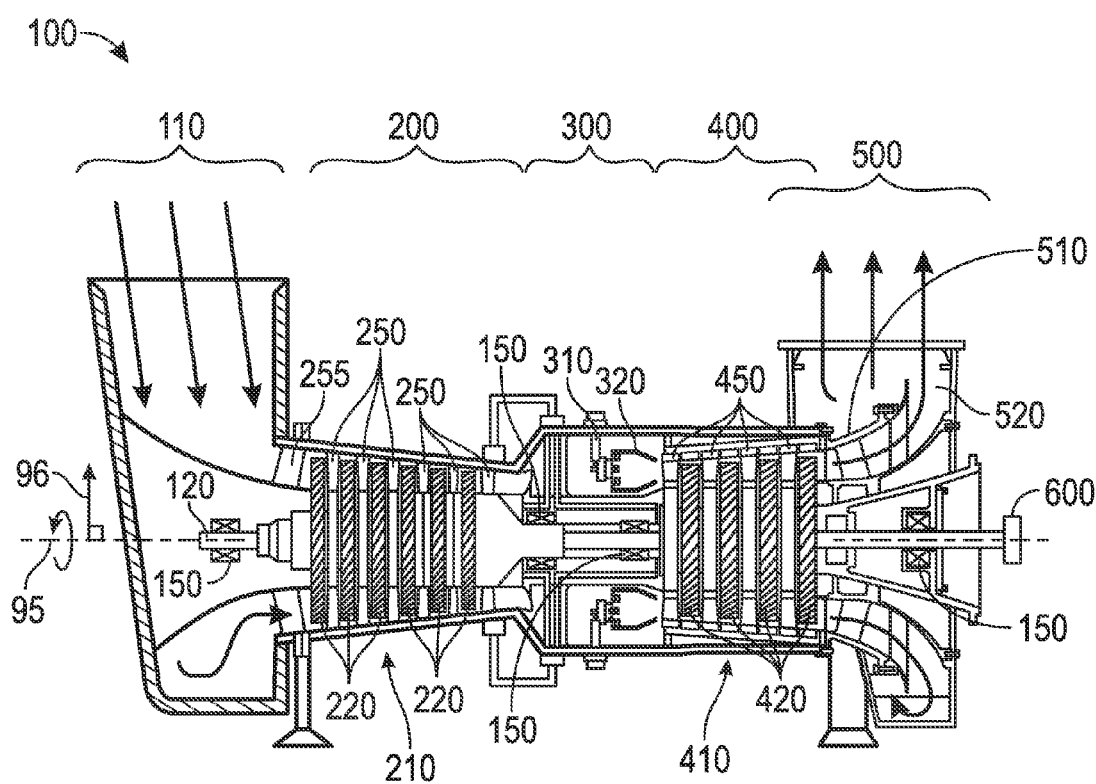
FIG. 1 is a schematic illustration of an exemplary circumferential machine.

A circumferential machine is a machine, such as a gas turbine engine or a centrifugal gas compressor that includes a primary axis with circumferential components revolved about the primary axis. A circumferential machine generally includes a shaft extending along the primary axis. FIG. 1 is a schematic illustration of an exemplary circumferential machine. As illustrated, the exemplary circumferential machine is a gas turbine engine 100. Some of the surfaces have been left out or exaggerated (here and in other figures) for clarity and ease of explanation. Also, the disclosure may reference a forward and an aft direction. Generally, all references to "forward" and "aft" are associated with the flow direction of primary air (i.e., air used in the combustion process), unless specified otherwise. For example, forward is "upstream" relative to primary air flow, and aft is "downstream" relative to primary air flow.

In addition, the disclosure may generally reference a center axis 95 of rotation of the gas turbine engine, which may be generally defined by the longitudinal axis of its shaft 120 (supported by a plurality of bearing assemblies 150). The center axis 95 may be common to or shared with various other engine concentric components. All references to radial, axial, and circumferential directions and measures refer to center axis 95, unless specified otherwise, and terms such as "inner" and "outer" generally indicate a lesser or greater radial distance from, wherein a radial 96 may be in any direction perpendicular and radiating outward from center axis 95.

A gas turbine engine 100 includes an inlet 110, a shaft 120, a compressor 200, a combustor 300, a turbine 400, an exhaust 500, and a power output coupling 600. The gas turbine engine 100 may have a single shaft or a multiple shaft configuration.

The compressor 200 includes a compressor rotor assembly 210, compressor stationary vanes (stators) 250, and inlet guide vanes 255. The compressor rotor assembly 210 mechanically couples to shaft 120. As illustrated, the compressor rotor assembly 210 is an axial flow rotor assembly. The compressor rotor assembly 210 includes one or more compressor disk assemblies 220. Each compressor disk assembly 220 includes a compressor rotor disk that is circumferentially populated with compressor rotor blades. Stators 250 axially follow each of the compressor disk assemblies 220. Each compressor disk assembly 220 paired with the adjacent stators 250 that follow the compressor disk assembly 220 is considered a compressor stage. Compressor 200 includes multiple compressor stages. Inlet guide vanes 255 axially precede the compressor stages.

The combustor 300 includes one or more fuel injectors 310 and includes one or more combustion chambers 320. The fuel injectors 310 may be annularly arranged about center axis 95.

The turbine 400 includes a turbine rotor assembly 410 and turbine nozzles 450. The turbine rotor assembly 410 mechanically couples to the shaft 120. As illustrated, the turbine rotor assembly 410 is an axial flow rotor assembly. The turbine rotor assembly 410 includes one or more turbine disk assemblies 420. Each turbine disk assembly 420 includes a turbine disk that is circumferentially populated with single crystal turbine blades 430. Turbine nozzles 450 axially precede each of the turbine disk assemblies 420. Each turbine disk assembly 420 paired with the adjacent turbine nozzles 450 that precede the turbine disk assembly 420 is considered a turbine stage. Turbine 400 includes multiple turbine stages.

The exhaust 500 includes an exhaust diffuser 510 and an exhaust collector 520. A power output coupling 600 may be located at an end of shaft 120.

FIG. 2 is cross-sectional view of an exemplary circumferential component of the circumferential machine of FIG. 1. As illustrated, the circumferential component is a combustion chamber 320 of gas turbine engine 100. Combustion chamber 320 includes an outer liner 330 and an inner liner 340. Combustion chamber 320 may also include a dome plate 322 and one or more heat shields 324. Outer liner 330 forms the outer radial boundary of the combustion chamber 320. Outer liner 330 may be a solid of revolution similar to a hollow cylinder. Outer liner 330 may include multiple outer panels 331 (individually identified in the figures as 331a, 331b, 331c, 331d, and 331e). In the embodiment illustrated, outer liner 330 includes seven outer panels 331. Any number of outer panels 331 may be used.

Each outer panel 331 may include an outer panel forward portion 337, and outer panel aft portion 338, an outer panel first end 332, an outer panel second end 333, an outer panel middle portion 339, and an outer panel transition portion 334. Each outer panel 331 is a solid of revolution. The outer panel forward portion 337 may be a hollow cylinder and includes the outer panel first end 332, the axially forward end of outer panel 331. The outer panel aft portion 338 may include a hollow cylinder or funnel like shape and includes the outer panel second end 333, the axially aft end of outer panel 331. The outer panel second end 333 may include an outer gap edge 359, the radially outer edge of outer panel second end 333. The outer panel middle portion 339 extends axially forward from outer panel aft portion 338. Outer panel middle portion 339 may also include a hollow cylinder or funnel like shape. The outer panel transition portion 334 extends between the outer panel forward portion 337 and the outer panel middle portion 339 expanding the diameter from the outer panel forward portion 337 to the outer panel middle portion 339.

Adjacent outer panels 331 overlap axially with the outer panel second end 333 of a first outer panel 331 being located axially aft of an outer panel first end 332 of a second outer panel 331. The outer panel forward portion 337 of the first outer panel 331 may be contiguous to the outer panel middle portion 339 and adjacent the outer panel aft portion 338 of the first outer panel 331. The panel outer transition portion 334 radially separates the second outer panel 331 from the outer panel aft portion 338 forming an outer panel gap 336 there between. Outer panel aft portion 338 may be a cantilever. Outer panels 331 may be an integral piece or may be metalurgically bonded at the contiguities between the outer panel forward portions 337 and the outer panel middle portions 339.

Outer panels 331 may also include an outer panel surface 357 and outer cooling holes 335. Outer panel surface 357 may be the radially inner surface of outer panel 331. Outer cooling holes 335 may extend through outer panel transition portion 334 and/or outer panel body portion 339 adjacent outer panel transition portion 334. Cooling air may be directed between a secondary outer liner and outer liner 330. The cooling air may then be directed through outer cooling holes 335 to cool outer liner 330. Other shapes, portions, surfaces and cooling holes may also be included in each outer panel 331.

Inner liner 340 forms the inner radial boundary of the combustion chamber 320 and is located radially inward from outer liner 330 forming a combustion zone 321 there between. Inner liner 340 may be a solid of revolution similar to a hollow cylinder. Inner liner 340 may include multiple inner panels 341 (individually identified in the figures as 341a, 341b, 341c, 341d, and 341e). In the embodiment illustrated, inner liner 340 includes seven inner panels 341. Any number of inner panels 341 may be used.

Each inner panel 341 may include an inner panel forward portion 347, and inner panel aft portion 348, an inner panel first end 342, an inner panel second end 343, an inner panel middle portion 349, and an inner panel transition portion 344. Each inner panel 341 is a solid of revolution. The inner panel forward portion 347 may be a hollow cylinder and includes the inner panel first end 342, the axially forward end of inner panel 341. The inner panel aft portion 348 may include a hollow cylinder or funnel like shape and includes the inner panel second end 343, the axially aft end of inner panel 341. The inner panel second end 343 may include an inner gap edge 358, the radially inner edge of inner panel second end 343. The inner panel middle portion 349 extends axially forward from inner panel aft portion 348. Inner panel middle portion 349 may also include a hollow cylinder or funnel like shape. The inner panel transition portion 344 extends between the inner panel forward portion 347 and the inner panel middle portion 349 expanding the diameter from the inner panel forward portion 347 to the inner panel middle portion 349.

Adjacent inner panels 341 overlap axially with the inner panel second end 343 of a first inner panel 341 being located axially aft of an inner panel first end 342 of a second inner panel 341. The inner panel forward portion 347 of the first inner panel 341 may be contiguous to the inner panel middle portion 349 and adjacent the inner panel aft portion 348 of the first inner panel 341. The inner panel transition portion 344 radially separates the second inner panel 341 from the inner panel aft portion 348 forming an inner panel gap 346 there between. Inner panel aft portion 348 may be a cantilever.

Inner panels 341 may also include an inner panel surface 356 and inner cooling holes 345. Inner panel surface 356 may be the radially inner surface of inner panel 341. Inner cooling holes 345 may extend through inner panel transition portion 344 and/or inner panel body portion 349 adjacent inner panel transition portion 344. Other cooling holes may also be present. Cooling air may be directed between a secondary inner liner and inner liner 340. The cooling air may then be directed through inner cooling holes 345 to cool inner liner 330. Other shapes, portions, surfaces and cooling holes may also be included in each inner panel 341.

Dome plate 322 may be an annular plate extending radially between the outer liner 330 and the inner liner 340 at the axially forward end of combustion chamber 320. Heat shields 324 may be located axially aft of dome plate 322. Each heat shield 324 may include an annular sector shape.

Figure 4:
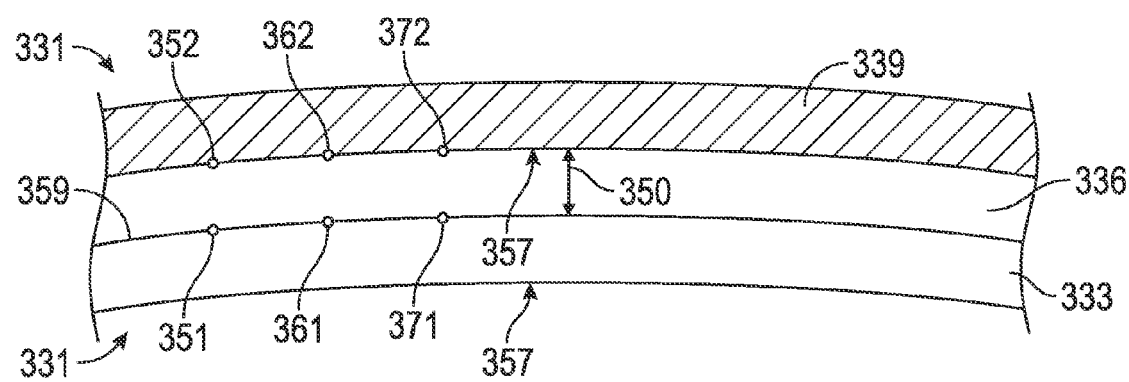
FIG. 4 is a circumferential cross-sectional view of a portion of the outer liner of FIGS. 2 and 3.

FIG. 3 is a cross-sectional view of a portion of the outer liner 330 of FIG. 2. FIG. 4 is a circumferential cross-sectional view of a portion of the outer liner 330 of FIGS. 2 and 3. Outer panel gap 336 and inner panel gap 346 may include a gap width 350. Referring to FIGS. 3 and 4, the gap width 350 for outer panel gap 336 may be the radial width between adjacent outer panels 331 from the outer panel second end 333 of a first outer panel 331 to a point on the outer panel middle portion 339 of a second outer panel 331 forming a perpendicular line to the outer panel middle portion 339. The gap width 350 for the inner panel gap 346 may be similarly defined.

One or more of the above components (or their subcomponents) may be made from stainless steel and/or durable, high temperature materials known as "superalloys". A superalloy, or high-performance alloy, is an alloy that exhibits excellent mechanical strength and creep resistance at high temperatures, good surface stability, and corrosion and oxidation resistance. Superalloys may include materials such as alloy x, WASPALOY, RENE alloys, alloy 188, alloy 230, INCOLOY, MP98T, TMS alloys, CMSX single crystal alloys, and exquiax alloy.

Figure 5:
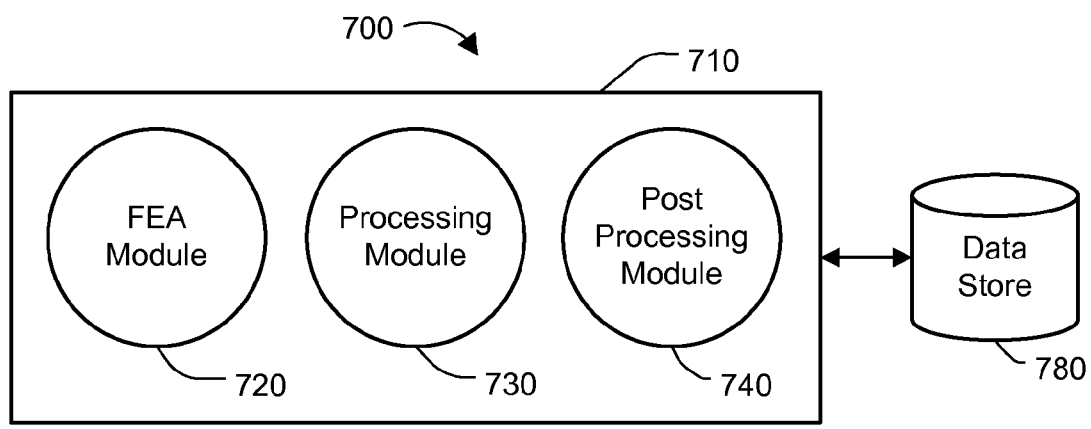
FIG. 5 is a functional block diagram of a finite element analysis system for designing a circumferential component for a circumferential machine.

FIG. 5 is a functional block diagram of a FEA system 700 for designing a component for a circumferential machine, such as gas turbine engine 100. The FEA system 700 may be implemented on a computer 710 or server that includes a processor for executing computer-software instructions, and a memory that can be used to store executable software program modules that can be executed by the processor. The memory includes a non-transitory computer readable medium used to store program instructions executable by the processor.

FEA analysis tools and methods may be used to evaluate the design of a component or for monitoring a component during operation. The component may be a circumferential component, a component that is generally revolved about an axis, such as the combustion chamber 320 of FIGS. 2-4. The design evaluation and the monitoring during operation may be done for one or more load cycles of the circumferential machine. The load cycles may be a set of hypothetical load cycles based on the design criteria or may be the actual load cycles of a particular circumferential machine. For example, a load cycle for a gas turbine engine, such as gas turbine engine 100, includes ramp periods, the transient periods such as start-up, ramp up, or ramp down periods, where the load and operating temperatures are increased or decreased, and dwell periods, the steady state periods, where the load and the operating temperatures and load are held relatively constant. A load cycle may include more than one ramp period and more than one dwell period.

FEA analysis tools and methods use the operating conditions for each load cycle, such as the gas turbine engine inlet temperatures, the turbine temperatures, the operating pressures, the gas turbine engine loads, the gas turbine engine shaft speeds, and the changes in time for each period of each load cycle to design and analyze the component.

The FEA system 700 may include an FEA module 720, a processing module 730, a post processing module 740, and a data store 780. The FEA module 720 may use a contiguous set of finite elements connected together by a set of nodes to form a mesh. The mesh may be a structured mesh, where the elements are uniform, or an unstructured mesh, where the elements are not uniform. An unstructured mesh may take more time/computational power to determine a solution than a structured mesh. The mesh may also be an orphan mesh, a mesh that does not have any geometry associated with it. Using the operating conditions for each load cycle, the FEA module 720 may model each load cycle and determine the effect each load cycle has on one or more of the nodes. The FEA module 720 may be configured to generate an output database, which may provide, inter alia, the location/displacement, the temperature, the stress, and the strain of each node prior to the first load cycle and after each subsequent load cycle.

The FEA system 700 may require a number of user defined inputs to prepare the model for analysis. The user defined inputs may be input directly into the FEA module 720 or may be input into another module or portion of the FEA system 700. The user defined inputs may include the selection of one or more seed nodes, the creation of a defined coordinate system, such as a cylindrical coordinate system, and a selection of an output subset. The one or more seed nodes may be a set of nodes that are representative of a feature of the component to be analyzed, such as a circumferential feature.

The defined coordinate system may be established relative to the feature of the component to be analyzed. The defined coordinate system may be a cylindrical coordinate system and depends on the shape of the feature to be analyzed. For example, if the feature to be analyzed is a circumferential edge, the cylindrical coordinate system may be established at the center of the circumferential edge. The output subset may be a set of the desired outputs to be analyzed, such as the location/displacement, the temperature, the stress, and the strain of each node.

The processing module 730 may query the FEA module 720 for the seed nodes and the defined coordinate system. The processing module 730 may report/display the results of the query to the user and may ask the user to verify that the results are correct. The processing module 730 may then create, such as by directing the FEA module 720 to create, a node set, which may include one or more node subsets, based off of the seed nodes following a predetermined geometric pattern from the seed nodes within the defined coordinate system, for example, along a circular/circumferential pattern within a cylindrical coordinate system. Each node subset may be a selectable group within the FEA model. The predetermined geometric pattern is defined by the desired feature of the component to be analyzed and may include a user adjusted tolerance around the feature to be analyzed to capture all of the nodes and node sets representative of that feature. The predetermined geometric pattern and tolerance may extend from each seed node to capture those nodes that are similarly situated to the seed nodes. When creating the node sets the processing module 730 may name each node set, each node subset, and each node.

The processing module 730 may also generate a journal file that includes the results from the query and the one or more sets and sub-sets of nodes created. The journal file may allow the particular analysis being created to be re-created/re-run without any user input.

The post processing module 740 may read the output database and search for the nodes within the predetermined geometric pattern. The post processing module 740 may be configured to sort the node set, including the node subsets, within the predetermined geometric pattern, such as pairing node subsets and placing the nodes/node subsets in order along the predetermined geometric pattern/feature to be analyzed. Once the nodes/node sets are sorted, the post processing module 740 may be configured to extract the selected output subset for each node prior to the first load cycle and after each subsequent load cycle including, inter alia, the location, the temperature, the stress, and the strain of each node. The selected output subset may be extracted to a database, such as one or more spreadsheets. In one embodiment, each node set is extracted to a separate spreadsheet.

The coordinates for the location of each node prior to the first load cycle (the undeformed coordinates) and after each subsequent load cycle (the deformed coordinates) may be provided in reference to the global coordinate system of the FEA module 720. The post processing module 740 may be configured to transform the undeformed coordinates and the deformed coordinates for each node from the global coordinate system to the defined coordinate system.

The post processing module 740 may then analyze the node set to determine a change in the feature to be analyzed, such as the distances between the nodes of two elements of the component. Each nodes subset may be selected to define a distance between two elements of the component along the predetermined geometric pattern. Each node subset may be used to determine the distance between the two elements at the given subset location along the predetermined geometric pattern.

The post processing module 740 may be configured to aggregate the determined changes, such as the determined distances between two elements of the component into a summary sheet, and may be configured to display the results. The results may be displayed by plotting the determined changes at each subset of elements for each load cycle in a presentable chart. The extracted results for each load cycle for the other selected outputs of the output subset may also be aggregated and displayed in a presentable chart.

The data store 780 may include, inter alia, the nodes, the mesh, the FEA model, the seed nodes, the names of each node, the predetermined geometric pattern, the global coordinate system, the defined coordinate system, the journal file, node names, an FEA model output, the spreadsheets, a spreadsheet template, and the like.

INDUSTRIAL APPLICABILITY

Industrial gas turbine engines may operate at temperatures of 1000 degrees Fahrenheit or more and at speeds of 10,000 revolutions per minute or more. Gas turbine engine components operating in these conditions often operate under high stresses and strains, which may result in deformation of the component over time.

It may be desirable to analyze the effects of one or more load cycles on a specific feature or element of a gas turbine engine component, such as an edge, a surface, or the minimum distances between the edge and surface. Solutions from large, detailed FEA models may require post-processing for results interrogation, which may be time-consuming using current FEA modeling tools.

Detailed FEA models may use upwards of one million nodes. Identifying the nodes for a specific feature or element of a gas turbine engine component may be time consuming and may take hours to complete. Extraction of the information for the selected output subset for the identified nodes may be limited to the information for one node over multiple load cycles or may be limited to multiple nodes for one load cycle. Extracting the information for multiple nodes over multiple load cycles may also be time consuming and take hours to complete. Use of the processing module 730 to identify the nodes for a specific feature and use of the post-processing module 740 to extract the selected output subset from the FEA model may significantly reduce the time spent by a user to less than an hour to identify the nodes and extract the selected output subset.

Figure 6:
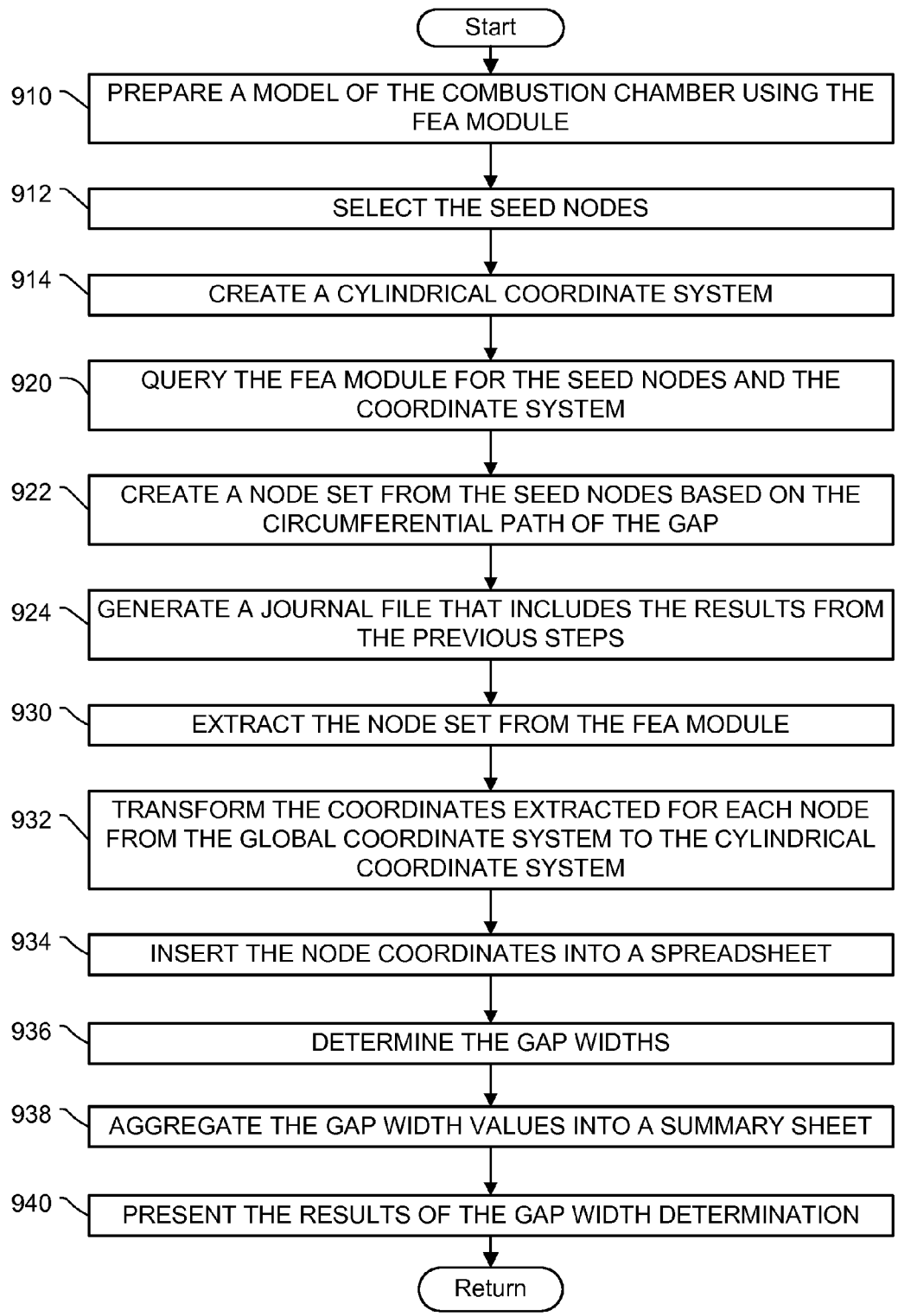
FIG. 6 is a flowchart of a process for assigning a gap width of the combustion chamber of FIGS. 2, 3, and 4.

FIG. 6 is a flowchart of a process assigning a gap width of the combustion chamber of FIGS. 2, 3, and 4. The process may include extracting and analyzing the output for a finite element analysis simulation data for a gap width 350 of an outer panel gap 336 or of an inner panel gap 346 for the combustion chamber 320 of FIGS. 2 and 3 over one or more load cycles. The various steps of the process can be performed by the FEA module 720, the processing module 730, and the post processing module 740. While the process as disclosed herein relates to assigning a gap width 350 of the combustion chamber 320, the process may be used to assign and analyze any selected feature of a component of a circumferential machine, such as gas turbine engine 100.

The process includes preparing a model of the combustion chamber 320 using the FEA module 720 at step 910. The process also includes selecting the seed nodes, such as a seed node subset including a first node 351, a second node 352, and a third node 353 illustrated in FIG. 3 at step 912. The seed node subset may represent similar groups of nodes that may be used to determine the gap width 350 about the circumferential length of outer panel gap 336/inner panel gap 346. First node 351, second node 352, and third node 353 may all be at the same circumferential location relative to the axis of the combustion chamber 320. First node 351 is located along outer gap edge 359.

The gap width 350 may be defined by the length of a line extending from first node 351 to outer panel surface 357 at a perpendicular angle. The model of combustion chamber 320 may not include a node at the point where the line is perpendicular to outer panel surface 357. Second node 352 and third node 353 are located on outer panel surface 357 at or near the same circumferential location as first node 351 and are the nodes closest to the point where the line is perpendicular to outer panel surface 357. The triangle formed by seed node subset may be used to determine gap width 350. The gap width 350 for an inner panel gap 346 may be determined relative to inner panel surface 356 in a similar manner.

The process may also include creating a coordinate system, such as a cylindrical coordinate system relative to the outer panel gap 336/inner panel gap 346 to be analyzed. The cylindrical coordinate system may be centered on the axis of the combustion chamber 320 and axially aligned with the gap width 350 to be analyzed, at step 914. The process may also include creating an output subset at step 916. The output subset includes the types of outputs from the FEA module 720 that the user would like to analyze. In the embodiment illustrated in this process, the output subset includes the location as a selected output. Steps 912, 914, and 916 may be done as part of step 910 within the FEA module 720.

The process may also include querying the FEA module 720 for the seed nodes and the coordinate system at step 920. Step 920 may include reporting the results of the query to the user and allowing the user to accept or reject the results of the query.

The process may further include creating a node set from the seed nodes based on the circumferential path of the outer panel gap 336/inner panel gap 346 within the coordinate system at step 922. The node set includes multiple subsets similar to the seed node subset. For example, a first node set may include a fourth node 361, a fifth node 362, and a sixth node (not shown) and a second node set may include a seventh node 371, an eighth node 372, and a ninth node (not shown). The fourth node 361 and the seventh node 371 may be determined from the first node 351 based on a circular path defined by outer gap edge 359. The fifth node 362 and the eighth node 372 may be determined from the second node 352 based on a circular path along outer panel surface 357. The sixth node and the ninth node may similarly be determined from the third node 353 based on a circular path along outer panel surface 357.

The node set may be selected using an annular tolerance set around each of the seed nodes along a circumferential path configured to find the nodes that are situated similar to the seed nodes relative to the outer panel gap 336/inner panel gap 346. In other embodiments, depending on the feature to be analyzed and the selected coordinate system, the tolerance may include a different shape and a different predetermined path.

The process may yet further include generating a journal file that includes the results from the previous steps including the seed nodes, the coordinate system and the node set created at step 924. The journal file may allow the previous steps to be re-run without any user input.

The process may also include extracting the node set from the FEA module 720 at step 930. Step 930 may include reading an output database file generated by the FEA module 720. Reading the output database file may be limited to the annular tolerance around each of the seed nodes along the circumferential path, which may reduce the extraction time. Step 930 may also include sorting the nodes and the subsets along the circumferential path. Step 930 may include extracting the undeformed coordinates of each node and the deformed coordinates of each node determined after each load cycle.

The process may further include transforming the coordinates extracted for each node, including the undeformed coordinates and each set of deformed coordinates, from the global coordinate system to the cylindrical coordinate system at step 932. In other embodiments analyzing other features, a Cartesian coordinate system may be used.

The process may yet further include inserting the node coordinates into a spreadsheet at step 934. When other outputs are selected within the output subsets, those values may also be inserted into the spreadsheet. An output for each element of the output subset for each node of the node set for each load cycle may be inserted into the spreadsheet. In some embodiments, one sheet is used for each subset of nodes within the node set. The single sheet may include the undeformed and deformed coordinates for the subset of nodes.

The process may further include determining the gap widths 350 at step 936. Determining the gap width 350 may include determining the gap width 350 for the undeformed outer panel gap 336/inner panel gap 346 and for each deformed outer panel gap 336/inner panel gap 346, and may also include determining a gap delta between the undeformed gap width 350 and each deformed gap width 350. The gap width 350 may be determined at for each node subset by using the triangle defined by the three nodes in each subset. For example, the gap width 350 may be defined as a line extending from the first node 351 to and bisecting a second line extending between the second node 352 and the third node 353.

The process may yet further include aggregating the gap width values into a summary sheet at step 938. The process may still further include presenting the results of the gap width determination to the user at step 940. The results for each gap width 350 at each circumferential location may be plotted for each load cycle in a chart for the user to analyze. Results for other outputs within an output subset or results for other features of gas turbine engine components may be similarly extracted, aggregated, and displayed to a user.

The FEA system 700 and the processes disclosed herein may be used to analyze a particular design of a gas turbine engine component or may be used to analyze a particular damaged gas turbine engine component, which may help improve the design of a component or modify an existing component. For example, a set of combustion chamber designs may be evaluated by the amount of change in the gap width 350 along outer panel gap 336/inner panel gap 346 for a given set of load cycles. A shrinking gap width 350 may reduce the flow of cooling air along outer panel surface 357/inner panel surface 356, resulting in hotter temperatures in the outer liner 330/inner liner 340 and a shorter service life of the outer liner 330/inner liner 340. The outer panel 331/inner panel 341 design with the smaller change in the gap width 350 along the outer panel gap 336/inner panel gap 346 may be assigned to the combustion chamber 320. The dimensions of one or more of the outer panels 331/inner panels 341 may be assigned based on the gap width determinations.

Those of skill will appreciate that the various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the design constraints imposed on the overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks and modules described in connection with the embodiments disclosed herein can be implemented or performed with a general purpose processor, a digital signal processor (DSP), application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The steps of a method or algorithm described in connection with the embodiments disclosed herein can be embodied directly in hardware, in a software module executed by a processor (e.g., of a computer), or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such that the processor can read information from, and write information to, the storage medium. In the alternative, the storage medium can be integral to the processor. The processor and the storage medium can reside in an ASIC.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A method for designing a component for a circumferential machine using a finite element analysis system including a finite element analysis module for one or more predetermined load cycles, the method comprising:
   preparing a model of the component using the finite element analysis module including selecting one or more seed nodes, creating a cylindrical coordinate system relative to the selected feature, and an output subset;
   querying the finite element analysis module for the one or more seed nodes and the cylindrical coordinate system;
   creating a node set from the one or more seed nodes based on a predetermined geometric path relative to the cylindrical coordinate system and defined by a selected feature of the component to be analyzed;
   extracting the node set from the finite element analysis module with an output for each element of the output subset for each node of the node set for each load cycle; and
   presenting a result of extracting the node set with the output for each element.

2. The method of claim 1, wherein creating the node set from the one or more seed nodes includes using a tolerance set around each of the one or more seed nodes along the predetermined geometric path configured to find nodes that are situated similar to the one or more seed nodes relative to the selected feature.

3. The method of claim 1, wherein extracting the node set includes inserting the node set with the output for each element into a spreadsheet and aggregating a value for each output into a summary sheet.

4. The method of claim 3, wherein aggregating the value for each output includes determining a change in the selected feature based on a change in position of each node of the node subset; and presenting the result of extracting the node set with the output for each element includes presenting the determined change in the selected feature.

5. The method of claim 1, further comprising generating a journal file that includes the selected one or more seed nodes, the selected output subset, and the node set.

6. A combustion chamber designed using the method of claim 1.

7. A combustion chamber designed using the method of claim 1, wherein a gap of the combustion chamber is assigned based on the presented results.

8. A method for assigning a gap between two panels of a combustion chamber for a gas turbine engine using a finite element analysis system including a finite element analysis module for one or more predetermined load cycles, the method comprising:
   preparing a model of the combustion chamber using the finite element analysis module including selecting a seed node subset that is used to determine a gap width at a circumferential location of the gap, and creating a cylindrical coordinate system relative to the gap;
   querying the finite element analysis module for the seed node subset and the cylindrical coordinate system;
   creating a node set from the seed node subset based on a circumferential path of the gap within the cylindrical coordinate system, the node set including a plurality of node subsets;
   extracting the node set from the finite element analysis module with a position of each node of the node set for each load cycle and transforming the position of each node for each load cycle from a global coordinate system of the finite element analysis module to the cylindrical coordinate system;
   determining a change in the gap width for each node subset of the plurality of node subsets for each load cycle; and
   presenting a result of the gap width determinations.

9. The method of claim 8, wherein creating the node set includes selecting nodes using an annular tolerance set around each seed node of the seed node subset along the circumferential path configured to find nodes that are situated similar to the seed nodes relative to the gap.

10. The method of claim 8, wherein the seed node subset and each node subset includes a first node, a second node, and a third node.

11. The method of claim 10, wherein the gap width for each node subset for each load cycle is a length of a first line extending from the first node to and bisecting a second line extending between the second node and the third node.

12. The method of claim 8, wherein extracting the node set from the finite element analysis module includes inserting the node set with the transformed position of each node for each load cycle into a spreadsheet.

13. The method of claim 8, further comprising generating a journal file that includes the selected seed node subset, the node set, and the cylindrical coordinate system.

14. The method of claim 8, wherein dimensions of one or more panels for the combustion chamber are assigned based on the results of the gap width determinations.

15. A combustion chamber designed using the method of claim 14.

16. A finite element analysis system for designing a component of a gas turbine engine, the finite element analysis system comprising:
a processor;
a finite element analysis module configured to model the component of the gas turbine engine into a contiguous set of finite elements connected together by a set of nodes and determine the effects one or more load cycles has on one or more nodes of the set of nodes;
a processing module configured to query the finite element analysis module for one or more selected seed nodes, and create a node set based off of the one or more selected seed nodes by selecting nodes from the set of nodes that are within a tolerance that follows a predetermined pattern from each of the one or more selected seed nodes; and
a post processing module configured to sort the node set in order along the predetermined geometric pattern, extract an output for the effect that each load cycle has on each node of the node set, aggregate the extracted output for the effect each load cycle has on each node of the node set, and display the aggregated output for the effect of each load cycle in a presentable chart.

17. The finite element analysis system of claim 16, wherein the finite element analysis module is configured to generate an output database file and the post processing module is configured to read the output database file to extract the output for the effect that each load cycle has on each node of the node set.

18. The finite element analysis system of claim 16, wherein the processing module is configured to query the finite element analysis module for a defined coordinate system and the post processing module is configured to transform undeformed coordinates for a position of each node of the node set and to transform deformed coordinates for the position of each node of the node set for each load cycle from a global coordinate system of the finite element analysis module to the defined coordinate system.

19. The finite element analysis system of claim 18, wherein the post processing module is configured to analyze the node set to determine a change in a feature of the component that is represented by the node set.

20. The finite element analysis system of claim 19, wherein the post processing determines a change in the feature by comparing the undeformed and deformed positions of each node of the node set.

* * * * *